United States Patent
Maejima (10) Patent No.: US 9,207,255 B2
(45) Date of Patent: Dec. 8, 2015

(54) SIGNAL PROCESSING DEVICE AND AMPLIFIER

(71) Applicant: Yamaha Corporation, Hamamatsu-shi, Shizuoka (JP)

(72) Inventor: Toshio Maejima, Iwata (JP)

(73) Assignee: Yamaha Corporation, Hamamtsu-shi (JP)

( * ) Notice: Subject to any disclaimer, the term of this patent is extended or adjusted under 35 U.S.C. 154(b) by 77 days.

(21) Appl. No.: 14/089,044

(22) Filed: Nov. 25, 2013

(65) Prior Publication Data

US 2014/0144229 A1    May 29, 2014

(30) Foreign Application Priority Data

Nov. 28, 2012   (JP) .................................. 2012-259732

(51) Int. Cl.
*G01P 15/14* (2013.01)
*H03F 3/45* (2006.01)
*G01C 19/5776* (2012.01)
*G01P 15/00* (2006.01)

(52) U.S. Cl.
CPC ............ *G01P 15/14* (2013.01); *G01C 19/5776* (2013.01); *G01P 15/00* (2013.01); *H03F 3/45183* (2013.01)

(58) Field of Classification Search
CPC ............................ H03G 5/18; H03F 2200/261
USPC ......................................... 330/141, 174, 281
See application file for complete search history.

(56) References Cited

U.S. PATENT DOCUMENTS

| 4,458,209 A * | 7/1984 | Miller et al. ................... 330/141 |
| 5,939,940 A | 8/1999 | Patti |
| 6,246,287 B1 * | 6/2001 | Yamashita ..................... 330/174 |
| 2009/0212867 A1 | 8/2009 | Fukuzawa et al. |

FOREIGN PATENT DOCUMENTS

| JP | 49-116045 | 10/1974 |
| JP | 64-54803 A | 3/1989 |
| JP | 11-144187 A | 5/1999 |
| JP | 2003-60934 A | 2/2003 |
| JP | 2005-317149 A | 11/2005 |
| JP | 2009-55547 A | 3/2009 |
| JP | 2009-200809 A | 9/2009 |

OTHER PUBLICATIONS

Japanese Office Action dated Feb. 10, 2015, with English translation (eight (8) pages).
Japanese Office Action issued in counterpart Japanese Application No. 2012-259732 dated Sep. 15, 2015, with English translation (eleven (11) pages).

* cited by examiner

*Primary Examiner* — Steven J Mottola
(74) *Attorney, Agent, or Firm* — Crowell & Moring LLP (57) ABSTRACT

A signal processing device includes: an amplifier, a bandwidth of which can be switched, and a controller which is configured to perform control to operate the amplifier in a wide bandwidth for a constant time after start of a signal input to the amplifier and then operate the amplifier in a narrow bandwidth thereafter.

7 Claims, 7 Drawing Sheets

SIGNAL PROCESSING DEVICE AND AMPLIFIER

CROSS-REFERENCE TO RELATED APPLICATION(S)

This application is based upon and claims the benefit of priority from prior Japanese patent application No. 2012-259732, filed on Nov. 28, 2012, the entire contents of which are incorporated herein by reference.

BACKGROUND

The present invention relates to a technique for amplifying the output signal of a sensor.

In recent years, the use of various kinds of sensors, such as a geomagnetic sensor and an acceleration sensor, is spreading rapidly. For example, these kinds of sensors are incorporated in a smartphone or the like to provide various services by using the direction and acceleration detected by the sensors. Since the output signals of these kinds of sensors are weak, the signals are generally used after amplified by an amplifier (refer to JP-A-11-144187).

Figure 7:
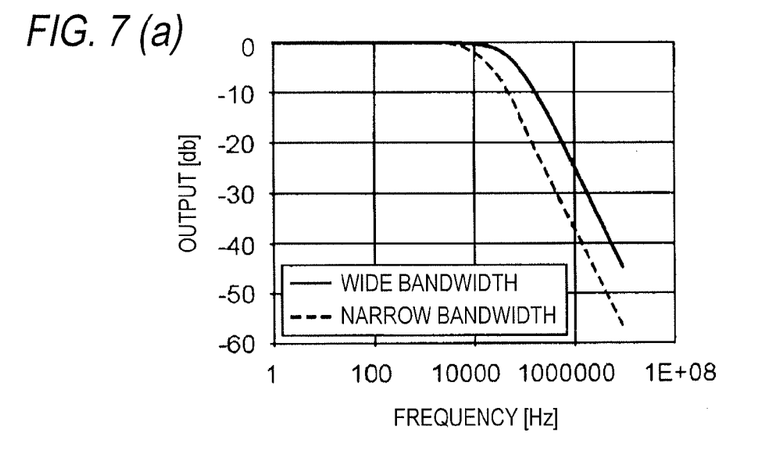
FIG. 7(a) is a graph showing the relationship between the frequency bands of an amplifier and the frequency characteristics and FIG. 7(b) is a graph showing the relationship between the frequency bands of an amplifier and the settling time thereof.

In the case that the output signal of a sensor is amplified by an amplifier, it is frequent that the amplifier is operated in a fixed frequency band in which the amplifier can perform amplification (in other words, the amplifier is operated in a wide bandwidth in the case that high-speed operation is performed). The reason for this is described below. FIG. 7($a$) is a graph showing the frequency characteristics of an amplifier in the case that the amplifier is operated in a narrow bandwidth and in the case that the amplifier is operated in a wide bandwidth (four times wider than the narrow bandwidth). FIG. 7($b$) is a graph showing the settling time of the amplifier in each case of the narrow bandwidth and the wide bandwidth. The settling time is a time required until the output of the amplifier converges after a rectangular step input is applied to the amplifier (in other words, a time required until the output signal of the amplifier stabilizes). As shown in FIG. 7($b$), the settling time is shorter in the case of the wide bandwidth. In the case that a physical state is detected by a sensor and an apparatus is controlled using the output signal of the sensor, in order that the change in the state is detected with a short delay and reflected to the control, it is necessary to operate an amplifier for amplifying the output signal of the sensor in the wide bandwidth and thereby to shorten the settling time of the amplifier. However, in the case that the amplifier is operated in the wide bandwidth, noise is also amplified and the S/N ratio of the signal after the amplification is lower than in the case that the amplifier is operated in the narrow bandwidth, whereby there occurs a problem that small changes in the output signal of the sensor cannot be captured.

SUMMARY

The present invention may provide a signal processing device and amplifier in which an output signal of a sensor is amplified by an amplifier and used, the S/N ratio thereof is improved while the time required until the output signal of the amplifier stabilizes is avoided from being extended.

The signal processing device may comprise an amplifier, a bandwidth of which can be switched, and a controller which is configured to perform control to operate the amplifier in a wide bandwidth for a constant time after start of a signal input to the amplifier and then operate the amplifier in a narrow bandwidth thereafter. Furthermore, the amplifier, a bandwidth of which can be switched, may be configured to detect start of a signal input thereto, operate in a wide bandwidth for a constant time after the start of the signal input and then operate in a narrow bandwidth thereafter.

In the case that the output signal of a sensor is amplified by the amplifier included in the signal processing device according to the present invention, when electric power supply to the sensor is started by power ON, for example, and the signal input to the amplifier is started, the amplifier operates in the wide bandwidth for the constant time after the start of the signal input to the amplifier. Hence, the settling time of the amplifier is short in comparison with the case in which the amplifier operates in the narrow bandwidth. Furthermore, since the amplifier is operated in the narrow bandwidth after the constant time has elapsed after the start of the signal input, the S/N ratio can be made high in comparison with the case in which the amplifier is operated continuously in the wide bandwidth. As described above, with the signal processing device according to the present invention, when the output signal of the sensor is amplified by the amplifier and used, the S/N ratio thereof can be improved while the time required until the output signal of the amplifier stabilizes is avoided from being extended.

With respect to the length of the above-mentioned constant time, the time elapsed after a step input was fed to the amplifier operating in the wide bandwidth until the output of the amplifier reaches approximately 99% of the convergence value thereof corresponding to the step input is obtained by actual measurement (or numeral simulation), and the length of the time may merely be used as the constant time. Approximately one percent of margin is herein provided to shorten the time (total settling time) required after the start of the signal input and the operation in the wide bandwidth and in the narrow bandwidth until the output signal of the amplifier stabilizes. This will be described later in detail.

As a further preferable mode, a mode can be conceived in which the controller performs a process in which each of a plurality of sensors is selected as a signal input source for the amplifier and the amplifier is operated in the wide bandwidth in response to start of a signal input from the selected signal input source. With this mode, the settling time can be made short in comparison with the case in which the amplifier is operated continuously in the narrow bandwidth. In the case that the signal input source before the switching and the signal input source after the switching are outputting signals having the same value before and after the switching of the signal input source, it is not necessary to change the amplification factor of the amplifier (in other words, the internal state of the amplifier), and it is not necessary to switch the bandwidth of the amplifier to the wide bandwidth and to settle the amplifier. For this reason, it may be possible, of course, that the controller performs a process in which only in the case that each of the plurality of sensors is selected as a signal input source for the amplifier and that the internal state of the amplifier changes depending on the switching of the signal input source, the amplifier is operated in the wide bandwidth in response to the start of the signal input from the selected signal input source. However, it is rare that the signal input source before the switching and the signal input source after the switching are outputting signals having the same value before and after the switching of the signal input source. Hence, no particular problem occurs even if the controller performs a process in which each time the switching of the signal input source occurs, the bandwidth of the amplifier is switched to the wide bandwidth regardless of whether the internal state of the amplifier has changed. As a result, the process performed by the controller can be simplified by not making the judgment as to whether the internal state of the amplifier has changed. As a still further preferable mode, a mode can be conceived in which in the case that the selected signal input source is a predetermined kind of sensor, the controller performs a process in which the bandwidth of the amplifier is switched to the narrow bandwidth after the constant time has elapsed after the start of the signal input from the signal input source. For example, in the case that geomagnetic and acceleration sensors are included as the above-mentioned plurality of sensors and that a geomagnetic sensor is selected as the signal input source, the controller performs the switching to the narrow bandwidth. It is frequent that the output signal of the geomagnetic sensor is weak in comparison with the output signal of the acceleration sensor, and it is assumed that the output signal is significantly affected by noise.

DETAILED DESCRIPTION OF EXEMPLARY EMBODIMENTS

Embodiments according to the present invention will be described below referring to the drawings.

1. First Embodiment

Figure 1:
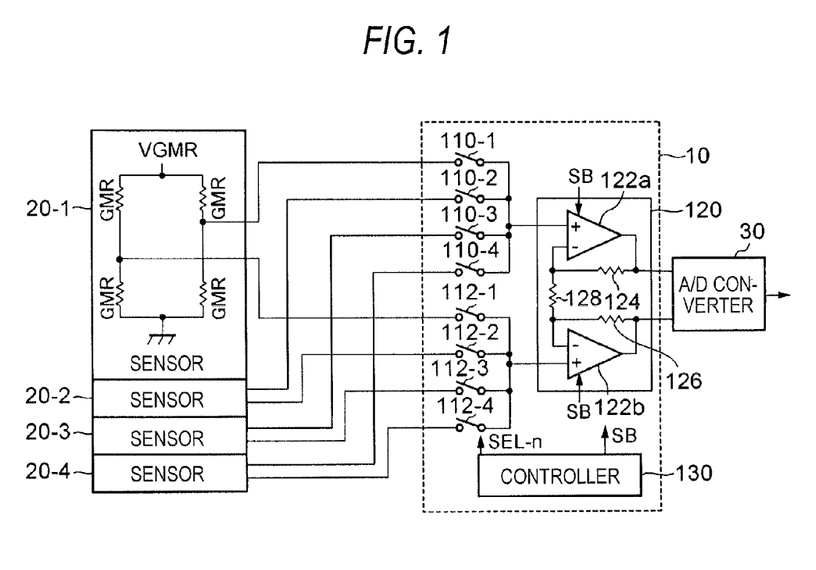
FIG. 1 is a block diagram showing a configuration example of a signal processing device according to a first embodiment of the present invention.

FIG. 1 is a block diagram showing a configuration example of a signal processing device 10 according to a first embodiment of the present invention.

The signal processing device 10 sequentially selects respective sensors 20-1 to 20-4 as signal input sources, amplifies the differential signal fed from a selected signal input source and supplies the signal to an A/D converter 30. The respective sensors 20-1, 20-2 and 20-3 are geomagnetic sensors and have the same configuration. In FIG. 1, a specific configuration example of only the sensor 20-1 is shown. These geomagnetic sensors are each configured by bridge-connecting four giant magneto-resistive elements GMR. In this embodiment, a tri-axial geomagnetic sensor is formed by the sensors 20-1, 20-2 and 20-3. The sensor 20-4 is a tri-axial acceleration sensor and outputs three sets of differential signals representing acceleration components in respective axial directions.

The signal processing device 10 includes switches 110-$n$ (n=1 to 4), switches 112-$n$ (n=1 to 4), an amplifier 120, and a controller 130 as shown in FIG. 1. The switch 110-$n$ is inserted between one signal output terminal of the sensor 20-$n$ and one signal input terminal of the amplifier 120, and the switch 112-$n$ is inserted between the other signal output terminal of the sensor 20-$n$ and the other signal input terminal of the amplifier 120. The ON/OFF switching of the switch 110-$n$ and the switch 112-$n$ is performed using the selection signal SEL-n output from the controller 130. For example, when the selection signal SEL-n is high, both the switch 110-$n$ and the switch 112-$n$ are turned ON; when the selection signal SEL-n is low, both the switch 110-$n$ and the switch 112-$n$ are turned OFF. In this embodiment, the switching of the signal input source for the amplifier 120 is accomplished by the ON/OFF control of the switch 110-$n$ and the switch 112-$n$. For example, in the case that the sensor 20-1 is selected as a signal input source, the switch 110-1 and the switch 112-1 may merely be turned ON and the switches 110-$n$ (n=2 to 4) and the switches 112-$n$ (n=2 to 4) may merely be turned OFF.

The amplifier 120 includes operational amplifiers 122a and 112b and resistors 124, 126 and 128 as shown in FIG. 1. One side of the differential signal output from the signal input source selected by the ON/OFF control of the switches 110-$n$ (n=1 to 4) and the switches 112-$n$ (n=1 to 4) is fed to the positive phase input terminal of the operational amplifier 122a, and the other side of the differential signal is fed to the positive phase input terminal of the operational amplifier 122b. The resistor 124 is inserted between the output terminal and the negative phase input terminal of the operational amplifier 122a, and the resistor 126 is inserted between the output terminal and the negative phase input terminal of the operational amplifier 122b. Furthermore, the negative phase input terminal of the operational amplifier 122a is connected to the negative phase input terminal of the operational amplifier 122b via the resistor 128. The resistance value of each of the resistors 124 and 126 is R, and the resistance value of the resistor 128 is r. When it is assumed that a voltage Vp is applied to the positive phase input terminal of the operational amplifier 122a and that a voltage Vn is applied to the positive phase input terminal of the operational amplifier 122b, the amplifier 120 amplifies the voltage difference (Vp−Vn) as represented by Expression (1) described below. In Expression (1) described below, Vop is the output voltage of the operational amplifier 122a, and Von is the output voltage of the operational amplifier 122b.

$$Vop-Von=(2R/r+1)(Vp-Vn) \quad (1)$$

In this embodiment, the amplification factor of the amplifier 120 is controlled by adjusting the resistance value R of each of the resistors 124 and 126 and the resistance value r of the resistor 128. The respective resistance values of the resistors 124, 126 and 128 are adjusted by the controller 130.

In this embodiment, an operational amplifier, the bandwidth of which can be controlled, is used for the operational amplifiers 122a and 122b. Hence, the bandwidth of the amplifier 120 can also be changed. In this embodiment, the switching of the bandwidth of the amplifier 120 can be accomplished by switching the bandwidths of the operational amplifiers 122a and 122b depending on the bandwidth control signal SB fed from the controller 130. More specifically, in the case that the bandwidth control signal SB being high is fed from the controller 130, the operational amplifiers 122a and 122b operate at a wide bandwidth (in other words, the amplifier 120 operates at the wide bandwidth); in the case that the bandwidth control signal SB being low is fed from the controller 130, the operational amplifiers 122a and 122b operate at a narrow bandwidth (in other words, the amplifier 120 operates at the narrow bandwidth).

Figure 2:
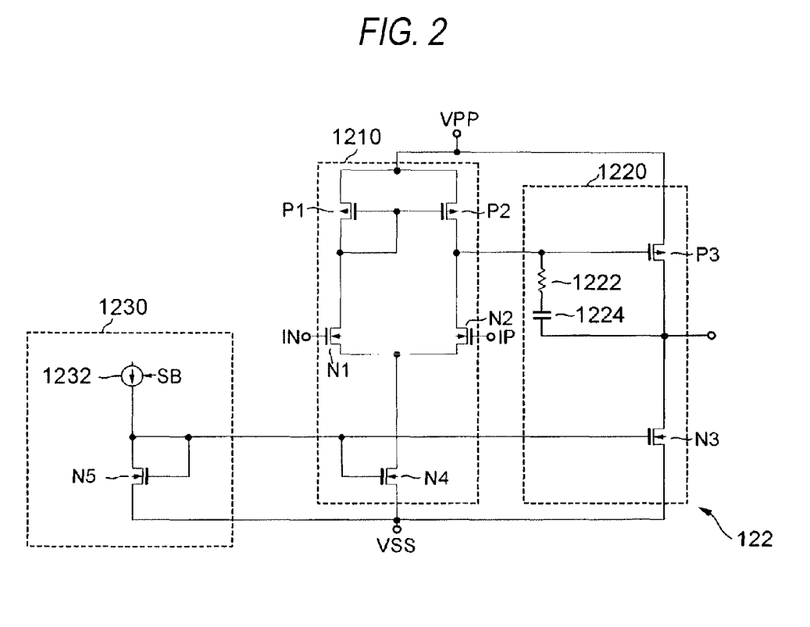
FIG. 2 is a circuit diagram showing a configuration example of an amplifier included in the device.

The configuration of the operational amplifier 122a is the same as that of the operational amplifier 122b. Hence, in the case that it is not necessary to make a distinction between the operational amplifiers 122a and 122b, each of the amplifiers is referred to as "operational amplifier 122" in the following description. FIG. 2 is a circuit diagram showing a configuration example of the operational amplifier 122. As shown in FIG. 2, the operational amplifier 122 includes a differential amplifier circuit 1210, an output circuit 1220 serving as the output stage of the operational amplifier 122, and a current controller 1230 for controlling the currents flowing through the differential amplifier circuit 1210 and the output circuit 1220.

The differential amplifier circuit 1210 is a circuit for amplifying the difference between the signal IP fed to the positive phase input terminal of the operational amplifier 122 and the signal IN fed to the negative phase input terminal thereof. As shown in FIG. 2, the differential amplifier circuit 1210 is composed of P-channel transistors P1 and P2 and N-channel transistors N1, N2 and N4. The sources of the P-channel transistors P1 and P2 are connected to a high-potential power source VPP, and the gates thereof are connected to the drain of the P-channel transistor P1. The drain of the N-channel transistor N1 is connected to the drain of the P-channel transistor P1, and the drain of the N-channel transistor N2 is connected to the drain of the P-channel transistor P2. The common connection point of the drain of the P-channel transistor P2 and the drain of the N-channel transistor N2 is used as the output terminal of the differential amplifier circuit 1210. The sources of the N-channel transistors N1 and N2 are commonly connected to each other, the N-channel transistor N4 is inserted between this common connection point and a low-potential power source VSS. The signals IN and IP are fed to the gates of the N-channel transistors N1 and N2, respectively, and the N-channel transistors N1 and N2 constitute a differential transistor pair. The P-channel transistors P1 and P2 are used as the loads of the N-channel transistors N1 and N2, respectively, and form a current mirror circuit.

The output circuit 1220 includes a P-channel transistor P3 and an N-channel transistor N3 connected in series between the high-potential power source VPP and the low-potential power source VSS. The common connection point of the drain of the P-channel transistor P3 and the drain of the N-channel transistor N3 is used as the output terminal of the output circuit 1220. The gate of the P-channel transistor P3 is connected to the output terminal of the differential amplifier circuit 1210. Between the common connection point of the two and the output terminal of the output circuit 1220, a resistor 1222 and a capacitor 1224 are connected in series for phase compensation.

The current controller 1230 is configured in which an N-channel transistor N5 is inserted between the low-potential power source VSS and a current source circuit 1232, the current value of the output current of which can be switched. The bandwidth control signal SB is fed to the current source circuit 1232. The current source circuit 1232 outputs a current having a current value I1 in the case that the bandwidth control signal SB being low is fed thereto. In the case that the bandwidth control signal SB being high is fed, the current source circuit outputs a current having a current value I2 (for example, I2=2×I1) larger than the current value I1. The gate of the N-channel transistor N5 is connected to the common connection point of the current source circuit 1232 and the drain of the N-channel transistor N5, and to the common connection point, the gates of the N-channel transistors N3 and N4 are connected. In other words, the N-channel transistor N5 is combined with the N-channel transistor N3 to form a current mirror circuit and is also combined with the N-channel transistor N4 to form another current mirror circuit. As a result, when it is assumed that the current value of the output current of the current source circuit 1232 is Iref, a current having a current value obtained by multiplying the current value Iref by the ratio of the sizes of the N-channel transistors N5 and N4 flows through the differential amplifier circuit 1210, and a current having a current value obtained by multiplying the current value Iref by the ratio of the sizes of the N-channel transistors N5 and N3 flows through the output circuit 1220. The larger the current flowing through each of the output circuit 1220 and the differential amplifier circuit 1210, the quicker the charging to the parasitic capacitance existing at the gate of each transistor. Consequently, the larger the current is, the wider the bandwidth of the operational amplifier 122 becomes. As a result, the operational amplifier 122 operates in the wide bandwidth when the bandwidth control signal SB being high is fed thereto and operates in the narrow bandwidth when the bandwidth control signal SB being low is fed thereto.

The controller 130 performs control to operate the amplifier 120 in the wide bandwidth for a constant time T after the start of the signal input to the amplifier 120 and to operate the amplifier in the narrow bandwidth thereafter. More specifically, in response to power ON of the system including the sensors 20-n (n=1 to 4), the signal processing device 10 and the A/D converter 30, the controller 130 first selects the sensor 20-1 and sets the amplification factor of the amplifier 120 so that the maximum value of the output signal of the sensor 20-1 corresponds to the maximum value of the voltage that can be input to the A/D converter 30. Hence, the signal input from the sensor 20-1 to the amplifier 120 is started. The controller 130 sets the bandwidth control signal SB high for the constant time T (that is, for the constant time T after the start of the signal input from the sensor 20-1) after power ON and sets the bandwidth control signal low thereafter (refer to FIG. 3).

Figure 4:
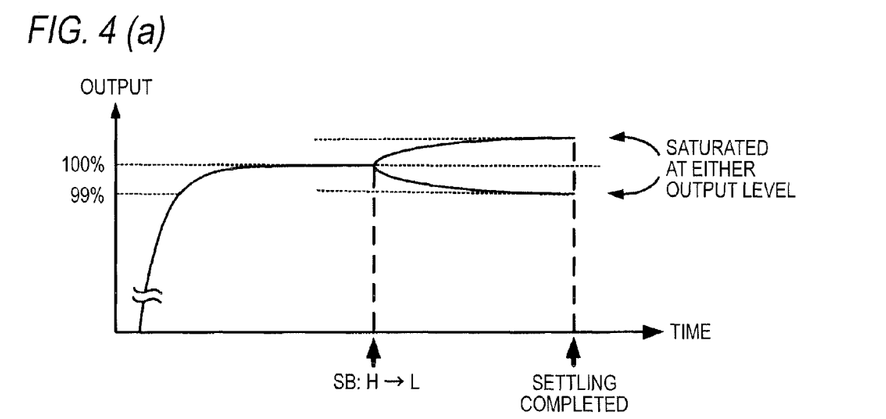
FIGS. 4(a) and 4(b) are graphs explaining the relationship between the timing of bandwidth switching and the length of total settling time.

As a result, the amplifier 120 operates in the wide bandwidth during the period until the constant time T elapses after power ON and operates in the narrow bandwidth thereafter. With respect to the length of the constant time T, the time elapsed after a step input was fed to the amplifier 120 operating in the wide bandwidth until the output of the amplifier 120 reaches approximately 99% of the convergence value thereof is obtained in advance by actual measurement (or numeral simulation), and the length of the time may merely be used as the constant time T. Approximately one percent of margin is herein provided because of the following reason. As shown in FIG. 4(a), it may be possible, of course, that the amplifier 120 is operated in the wide bandwidth, and that the switching from the wide bandwidth to the narrow bandwidth is performed after waiting for the output of the amplifier 120 to become saturated. For example, the time until the output of the amplifier 120 becomes saturated sufficiently is obtained by actual measurement (or numeral simulation), and the length of the time may merely be used as the constant time T. However, in this case, the offset of the amplifier changes due to the switching of the bandwidth from the wide bandwidth to the narrow bandwidth. Hence, as shown in FIG. 4(a), after the switching to the narrow bandwidth, it is necessary to wait for the output of the amplifier 120 to become saturated. On the other hand, as shown in FIG. 4(b), in the case that the switching from the wide bandwidth to the narrow bandwidth is performed when the output of the amplifier 120 has reached approximately 99% of the convergence value thereof, the total settling time of the amplifier can be shortened. In order that the total settling time can be shortened in this way, the length of the constant time T is determined while approximately one percent of margin is provided.

As shown in FIG. 7(b), in an amplifier, although the settling time thereof becomes shorter, the S/N ratio thereof becomes lower in the case that the amplifier is operated in the wide bandwidth than in the case that the amplifier is operated in the narrow bandwidth. This is also applicable similarly to the amplifier 120. In this embodiment, the amplifier 120 is operated in the wide bandwidth for the constant time T after power ON to shorten the settling time. Furthermore, the amplifier 120 is operated in the narrow bandwidth after the constant time T has elapsed to raise the S/N ratio of the output signal of the amplifier 120.

When the settling of the amplifier 120 at power ON is completed as described above, the controller 130 performs the ON/OFF switching of the switches 110-$n$ (n=1 to 4) and the switches 112-$n$ (n=1 to 4) depending on instructions or the like from a rear-stage circuit, thereby switching the signal input source for the amplifier 120. At the time of this switching, the controller 130 sets the bandwidth control signal SB high and performs control to operate the amplifier 120 again in the wide bandwidth. Furthermore, after the constant time has elapsed after the switching of the signal input source, the controller 130 sets the bandwidth control signal SB low and then performs control to operate the amplifier 120 in the narrow bandwidth. In other words, in this embodiment, the controller 130 performs a process in which the amplifier 120 is operated once in the wide bandwidth each time the signal input source for the amplifier 120 is switched, namely, in response to start of a signal input from the switched signal input source, and then the bandwidth of the amplifier 120 is switched to the narrow bandwidth at the time when the constant time has elapsed after the switching of the signal input source. This process is performed to obtain a high S/N ratio while the total settling time associated with the switching of the signal input source is shortened as described above. However, in the case that the signal input source before the switching and the signal input source after the switching are outputting signals having the same value before and after the switching of the signal input source, it is not necessary to change the amplification factor of the amplifier 120 (in other words, the internal state of the amplifier 120), and it is not necessary to settle the amplifier 120 again. Accordingly, it is conceivable, of course, that the controller 130 performs a process in which only in the case that the internal state of the amplifier 120 changes depending on the switching of the signal input source, the amplifier 120 is operated in the wide bandwidth in response to the start of the signal input, and then the bandwidth of the amplifier 120 is switched to the narrow bandwidth after the constant time has elapsed. However, it is rare that the signal input source before the switching and the signal input source after the switching are outputting signals having the same value before and after the switching of the signal input source. Hence, no particular problem occurs even if the controller 130 performs a process in which each time the switching of the signal input source occurs, the bandwidth of the amplifier is switched once to the wide bandwidth regardless of whether the internal state of the amplifier 120 has changed and then the bandwidth is switched to the narrow bandwidth after the constant time has elapsed. The process performed by the controller 130 can thus be simplified. Consequently, in this embodiment, the controller 130 is configured to perform the process in which the amplifier 120 is operated once in the wide bandwidth each time the signal input source for the amplifier 120 is switched and then the bandwidth of the amplifier 120 is switched to the narrow bandwidth at the time when the constant time has elapsed after the switching of the signal input source. Furthermore, although the amplifier 120 is operated in the wide bandwidth each time the switching of the signal input source occurs, it may be possible that the switching to the narrow bandwidth after the constant time T has elapsed from the start of the signal input may be performed in the case that a newly selected signal input source is a predetermined kind of sensor. For example, in the case that the signal input source is switched to an acceleration sensor, the switching to the narrow bandwidth is not performed; however, in the case that the signal input source is switched to a geomagnetic sensor, the switching to the narrow bandwidth is performed. It is frequent that the output signal of the geomagnetic sensor is weak in comparison with the output signal of the acceleration sensor and it is assumed that the output signal is significantly affected by noise. On the other hand, the output signal of the acceleration sensor is not much affected by noise and it is thus conceivable that no serious problem will occur even if the amplifier 120 is operated continuously in the wide bandwidth.

As described above, with this embodiment, when each output signal of the sensors 20-$n$ (n=1 to 4) is amplified by the amplifier 120 and fed to the A/D converter 30, the S/N ratio can be improved while the time required until the output signal of the amplifier stabilizes is avoided from being extended. In addition, with this embodiment, since the time required after the start of the signal input to the amplifier 120 until the output signal stabilizes can be shortened, this embodiment is advantageous for performing, for example, a usage method in which a circuit is started at the time when measurement is performed using a sensor or the like and then the circuit is stopped after the measurement.

2. Second Embodiment

Figure 5:
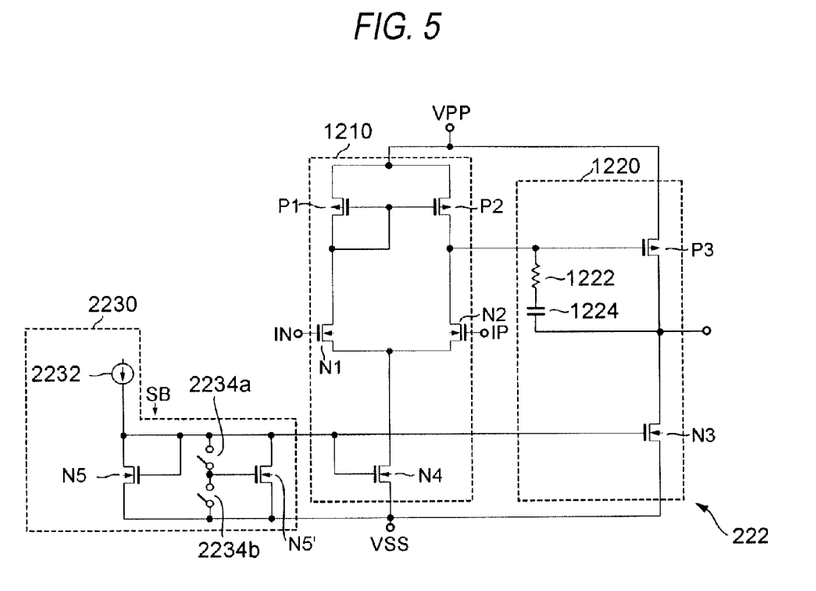
FIG. 5 is a circuit diagram showing a configuration example of an operational amplifier included in an amplifier for use in a signal processing device according to a second embodiment of the present invention.

Next, a second embodiment according to the present invention will be described. This embodiment differs from the first embodiment in that the amplifier for amplifying the output signal of the sensor 20-$n$ is configured using the operational amplifier 222 shown in FIG. 5 instead of the operational amplifier 122 configured as shown in FIG. 2 described above. In FIG. 5, the same components as those shown in FIG. 2 are designated by the same reference codes. The operational amplifier 222 differs from the operational amplifier 122 in that a current controller 2230 is provided instead of the current controller 1230 as being obvious from the comparison between FIG. 2 and FIG. 5. Furthermore, the current controller 2230 differs from the current controller 1230 in that a current source circuit 2232 is provided instead of the current source circuit 1232 and that an N-channel transistor N5' and switches 2234a and 2234b are newly provided.

The current source circuit 2232 is a constant current source circuit and outputs a current having a fixed current value. The switches 2234a and 2234b are inserted in series between the common connection point of the current source circuit 2232 and the drain of the N-channel transistor N5 and the low-potential power source VSS. Furthermore, the N-channel transistor N5' is inserted between the common connection point and the low-potential power source VSS. Moreover, the gate of the N-channel transistor N5' is connected to the common connection point of the switches 2234a and 2234b.

The switches 2234a and 2234b are turned ON/OFF depending on the signal level of the bandwidth control signal SB. In this embodiment, in the case that the bandwidth control signal SB being high is fed, the switch 2234a is turned OFF and the switch 2234*b* is turned ON. Conversely, in the case that the bandwidth control signal SB being low is fed, the switch 2234*a* is turned ON and the switch 2234*b* is turned OFF. In the state (first state) in which the switch 2234*a* is turned OFF and the switch 2234*b* is turned ON, the N-channel transistor N5' is turned OFF. In this state, the output current of the current source circuit 2232 entirely passes through the N-channel transistor N5 and flows to the low-potential power source VSS.

On the other hand, in the state (second state) in which the switch 2234*a* is turned ON and the switch 2234*b* is turned OFF, the N-channel transistor N5' is turned ON, and the output current of the current source circuit 2232 passes through both the N-channel transistors N5 and N5' and flows to the low-potential power source VSS. In other words, in the case that the N-channel transistor N5' and the N-channel transistor N5 have the same size, the current value of the current flowing through the N-channel transistor N5 in the second state becomes half of that in the first state, and the current value of the current flowing through each of the N-channel transistor N3 and the N-channel transistor N4 also becomes half. In other words, in this embodiment, the current values of the currents flowing through the output circuit 1220 and the differential amplifier circuit 1210 are switched by performing the ON/OFF switching of the switch 2234*a* and the switch 2234*b*, whereby the bandwidth of the amplifier including the operational amplifier 222 is switched.

Figure 3:
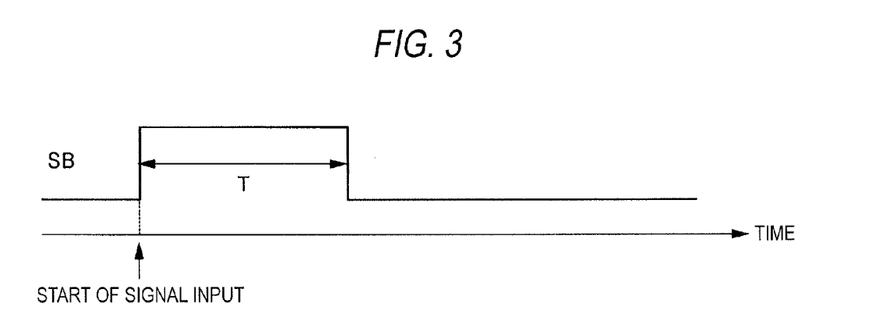
FIG. 3 is a timing chart for explaining the operation of the controller included in the device.

Also in this embodiment, the controller 130 performs the process in which the sensor 20-1 is selected in response to power ON and the signal value of the bandwidth control signal SB is switched as shown in FIG. 3, whereby the S/N ratio can be avoided from becoming lower while the time required until the output signal of the amplifier according to this embodiment stabilizes is avoided from being extended.

3. Third Embodiment

In the above-mentioned first and second embodiments, the case in which the bandwidth of the amplifier is switched by switching the current values of the currents flowing through the differential amplifier circuit and the output circuit of the operational amplifier included in the amplifier for amplifying the output signal of the sensor 20-*n* has been described. However, the switching of the bandwidth may be accomplished by switching the resistance values of the feedback resistance and the input resistance constituting the amplifier together with the operational amplifiers. As an example of a configuration in which the switching of the bandwidth is accomplished by switching these resistance values, the configuration shown in FIG. 6 may be conceived in which an amplifier 320 is used instead of the amplifier 120 shown in FIG. 1.

Figure 6:
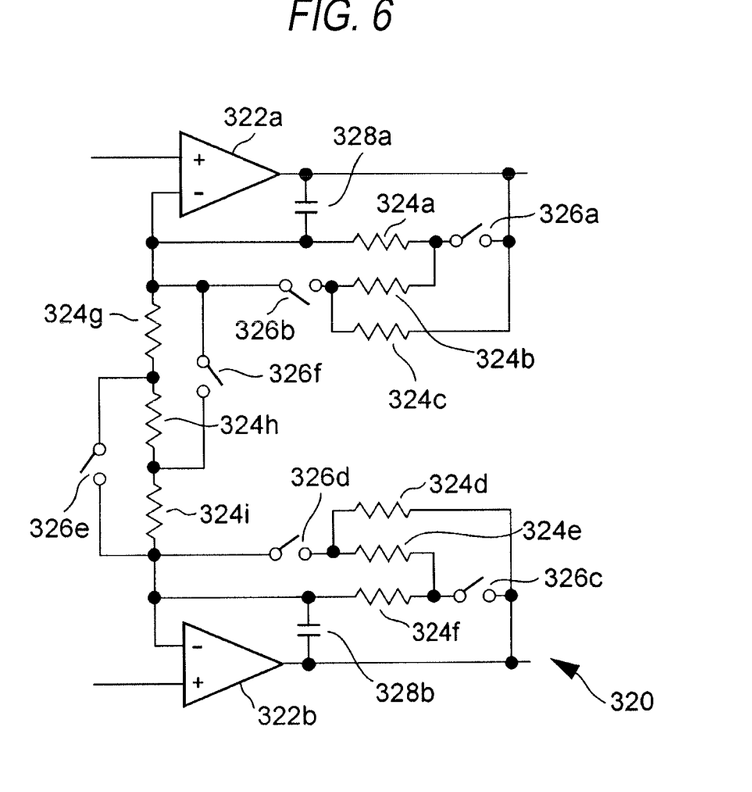
FIG. 6 is a circuit diagram showing a configuration example of an amplifier for use in a signal processing device according to a third embodiment of the present invention.

As shown in FIG. 6, the amplifier 320 includes operational amplifiers 322*a* and 322*b*, resistors 324*a* to 324*j*, switches 326*a* to 326*f*, and capacitors 328*a* and 328*b*. The resistance value of each of the resistors 324*a* to 324*f* is R, and the resistance value of each of the resistors 324*g* to 324*i* is r. Furthermore, the capacitance of each of the capacitors 328*a* and 328*b* is C. However, all the resistance values of the resistors 324*a* to 324*f* are not required to be the same, and all the resistance values of the resistors 324*g* to 324*i* are not required to be the same. In the case that resistance value of each of the resistors 324*a* and 324*f* is R1, that the resistance value of each of the resistors 324*b* and 324*e* is R2, that the resistance value of each of the resistors 324*c* and 324*d* is R3, and that the resistance values of the resistors 324*g*, 324*h* and 324*i* are r1, r2 and r3, respectively, the ratio R1:R2:R3=r1:r2:r3 may merely be established.

Unlike the operational amplifier 122 according to the first embodiment and the operational amplifier 222 according to the second embodiment, the operational amplifiers 322*a* and 322*b* do not have a configuration for switching the bandwidth. The capacitor 328*a* is inserted between the output terminal and the negative phase input terminal of the operational amplifier 322*a*. The resistors 324*a*, 324*b* and 324*c* are inserted in series between the common connection point of the negative phase input terminal of the operational amplifier 322*a* and the capacitor 328*a* and the output terminal of the operational amplifier 322*a*. Furthermore, the common connection point of the resistors 324*a* and 324*b* is connected to the output terminal of the operational amplifier 322*a* via the switch 326*a*, and the common connection point of the resistors 324*b* and 324*c* is connected to the negative phase input terminal of the operational amplifier 322*a* via the switch 326*b*.

The capacitor 328*b* is inserted between the output terminal and the negative phase input terminal of the operational amplifier 322*b*. The resistors 324*d*, 324*e* and 324*f* are inserted in series between the common connection point of the negative phase input terminal of the operational amplifier 322*b* and the capacitor 328*b* and the output terminal of the operational amplifier 322*b*. Furthermore, the common connection point of the resistors 324*e* and 324*f* is connected to the output terminal of the operational amplifier 322*b* via the switch 326*c*, and the common connection point of the resistors 324*d* and 324*e* is connected to the negative phase input terminal of the operational amplifier 322*b* via the switch 326*d*.

Moreover, the resistors 324*g*, 324*h* and 324*i* are inserted in series between the negative phase input terminal of the operational amplifier 322*a* and the negative phase input terminal of the operational amplifier 322*b*. The common connection point of the resistors 324*g* and 324*h* is connected to the negative phase input terminal of the operational amplifier 322*b* via the switch 326*e*, and the common connection point of the resistors 324*h* and 324*i* is connected to the negative phase input terminal of the operational amplifier 322*a* via the switch 326*f*.

The switches 326*a* to 326*f* are each turned ON in the case that the bandwidth control signal SB being high is fed, and turned OFF in the case that the bandwidth control signal SB being low is fed. In the state in which all the switches 326*a* to 326*f* are turned OFF, the resistors 324*a*, 324*b* and 324*c* are connected in series between the output terminal and the negative phase input terminal of the operational amplifier 322*a*, the resistors 324*d*, 324*e* and 324*f* are connected in series between the output terminal and the negative phase input terminal of the operational amplifier 322*b*, and the resistors 324*g*, 324*h* and 324*i* are connected in series between the negative phase input terminals of the operational amplifiers 322*a* and 322*b*. In other words, in the state in which all the switches 324*a* to 324*f* are turned OFF, a negative feedback active low-pass filter having an input resistance 3r, a feedback resistance 3R and a capacitance C is formed by the operational amplifier 322*a*, the resistors 324*a* to 324*c*, the resistors 324*g* to 324*i* and the capacitor 328*a*. Similarly, a negative feedback active low-pass filter having an input resistance 3r, a feedback resistance 3R and a capacitance C is formed by the operational amplifier 322*b*, the resistors 324*d* to 324*f*, the resistors 324*g* to 324*i* and the capacitor 328*b*.

On the other hand, in the state in which all the switches 326*a* to 326*f* are turned ON, the resistors 324*a*, 324*b* and 324*c* are connected in parallel between the output terminal and the negative phase input terminal of the operational amplifier 322*a*, the resistors 324*d*, 324*e* and 324*f* are connected in parallel between the output terminal and the negative phase input terminal of the operational amplifier 322b, the resistors 324g, 324h and 324i are connected in parallel between the negative phase input terminals of the operational amplifiers 322a and 322b. In other words, in the state in which all the switches 326a to 326f are turned ON, a negative feedback active low-pass filter having an input resistance r/3, a feedback resistance R/3 and a capacitance C is formed by the operational amplifier 322a, the resistors 324a to 324c, the resistors 324g to 324i and the capacitor 328a. Similarly, a negative feedback active low-pass filter having an input resistance r/3, a feedback resistance R/3 and a capacitance C is formed by the operational amplifier 322b, the resistors 324d to 324f, the resistors 324g to 324i and the capacitor 328b.

The cut-off frequency (the upper-limit frequency in the frequency band in which the amplifier 320 can perform amplification) of each of the above-mentioned negative feedback active low-pass filters has a value corresponding to the reciprocal of the product of the resistance value of the feedback resistance and the capacitance C, and the amplification factor has a value corresponding to the ratio of the input resistance to the feedback resistance. In the state in which all the switches 326a to 326f are turned OFF, the feedback resistance is 3R, and in the state in which all the switches 326a to 326f are turned ON, the feedback resistance is R/3. Hence, the frequency band in which the amplifier can perform amplification is wider in the state in which all the switches 326a to 326f are turned ON. In other words, when all the switches 326a to 326f are turned ON, the amplifier 320 operates in the wide bandwidth, and when all the switches 326a to 326f are turned OFF, the amplifier 320 operates in the narrow bandwidth. Furthermore, the ratio of the input resistance to the feedback resistance in each of the negative feedback active low-pass filters is unchanged and the amplification factor of the amplifier 320 is unchanged regardless of whether all the switches 326a to 326f are turned ON or OFF. In other words, in the amplifier 320 according to this embodiment, the frequency band in which the amplifier can perform amplification can be switched (switched between two stages: the wide bandwidth and the narrow bandwidth) while the amplification factor is held constant by performing the ON/OFF switching of all the switches 326a to 326f simultaneously.

Also in the signal processing device according to this embodiment, although not shown in detail in FIG. 6, the controller 130 selects the sensor 20-1 at power ON, and outputs the bandwidth control signal SB being high for the constant time T, and then outputs the bandwidth control signal SB being low. Hence, the amplifier 320 operates in the wide bandwidth for the constant time T after the start of the signal input from the sensor 20-1 and operates in the narrow bandwidth thereafter. Consequently, also in this embodiment, the S/N ratio can be avoided from becoming lower while the time required until the output signal of the amplifier 320 stabilizes is avoided from being extended. In this embodiment, the bandwidth of the amplifier 320 is switched by switching the value of the feedback resistance while the ratio of the input resistance to the feedback resistance in each of the negative feedback active low-pass filters constituting the amplifier 320 is held constant. However, the switching of the bandwidth may be accomplished by setting the resistance values of the input resistance and the feedback resistance in each of the negative feedback active low-pass filters to fixed values and by switching the value of the capacitance C.

4. Modification Examples

The present invention is not limited to the above-mentioned embodiments, but various modifications described below can be made, for example.

(1) In the first and second embodiments described above, the current value of the current flowing through the output circuit and the differential amplifier circuit is switched between two stages: the current value during the wide bandwidth operation and the current value during the narrow bandwidth operation. However, the current value may be switched in multiple stages. Furthermore, the resistance values of the input resistance and the feedback resistance in the third embodiment described above may also be switched in multiple stages.

(2) In the above-mentioned embodiments, the controller for switching the bandwidth of the amplifier, the bandwidth of which can be switched, is provided separately from the amplifier. However, a controller for switching the bandwidth upon detecting the start of the signal input to the amplifier may be incorporated in the amplifier, or a controller for switching the bandwidth upon detecting the internal state of the amplifier may be incorporated in the amplifier.

(3) In the above-mentioned embodiments, the circuit configurations in which MOS transistors are used have been described. However, without being limited to MOS transistors, other types of transistors, such as bipolar transistors, may be used to configure the circuits.

(4) In the above-mentioned embodiments, the case in which the sensor serving as a signal input source to the amplifier is an acceleration sensor or a geomagnetic sensor has been described. However, other types of sensors, such as a gyro sensor, may also be used as a matter of course. Furthermore, it is not essential that a plurality of sensors serving as the signal input sources to the amplifier are provided, but one sensor may be used.

(5) In the above-mentioned embodiments, for example, the wide bandwidth is 60 kHz, and the narrow bandwidth is 15 kHz. Another values may be adopted as the wide bandwidth and the narrow bandwidth.

What is claimed is:

1. A signal processing device, comprising:
an amplifier, a bandwidth of which can be switched; and
a controller which is configured to perform control to operate the amplifier in a wide bandwidth for a constant time after start of a signal input to the amplifier and then operate the amplifier in a narrow bandwidth thereafter,
wherein the controller is configured to select each of a plurality of sensors as a signal input source for the amplifier, and to perform control to operate the amplifier in the wide bandwidth in response to start of a signal input from the selected signal input source.

2. The signal processing device according to claim 1, wherein the signal input to the amplifier is supplied from a sensor, and the sensor is one of an acceleration sensor, a geomagnetic sensor and a gyro sensor.

3. The signal processing device according to claim 1, wherein in a case that the selected signal input source is a predetermined kind of sensor, the controller switches the bandwidth of the amplifier to the narrow bandwidth after the constant time has elapsed after the start of the signal input from the signal input source.

4. The signal processing device according to claim 3, wherein the plurality of sensors includes at least one of an acceleration sensor, a geomagnetic sensor and a gyro sensor, the predetermined kind of sensor is the geomagnetic sensor.

5. An amplifier, wherein:
a bandwidth of the amplifier is switchable, the amplifier being configured to detect start of a signal input thereto, and being configured to operate in a wide bandwidth for a constant time after the start of the signal input and then operate in a narrow bandwidth thereafter, the amplifier comprising an operational amplifier, which comprises:
a differential amplifier circuit;
an output circuit; and
    a current controller including a current source circuit configured to control a value of a current flowing through the differential amplifier circuit and the output circuit, wherein
when the value of the current is a first value, the amplifier operates in the narrow bandwidth, and
when the value of the current is a second value larger than the first value, the amplifier operates in the wide bandwidth.

6. An amplifier, wherein:
a bandwidth of the amplifier is switchable, the amplifier being configured to detect start of a signal input thereto, and being configured to operate in a wide bandwidth for a constant time after the start of the signal input and then operate in a narrow bandwidth thereafter, the amplifier comprising an operational amplifier, which comprises:
a differential amplifier circuit;
an output circuit; and
    a current controller including: a current source circuit; an N-channel transistor; and a switch, wherein the current source circuit outputs a current having a fixed value and the current flows through the differential amplifier circuit and the output circuit, wherein when the switch is in a first state, the N-channel transistor is turned OFF, and the amplifier operates in the wide bandwidth, and
when the switch is in a second state, the N-channel transistor is turned ON, and the amplifier operates in the narrow bandwidth.

7. An amplifier, wherein:
a bandwidth of the amplifier is switchable, the amplifier being configured to detect start of a signal input thereto, and being configured to operate in a wide bandwidth for a constant time after the start of the signal input and then operate in a narrow bandwidth thereafter, the amplifier comprising:
an operational amplifier;
a resistor;
a switch; and
a capacitor, wherein
when the switch is turned ON, a negative feedback active low-pass filter having a first parameter is formed by the operational amplifier, the resistor and the capacitor, and the amplifier operates in the wide bandwidth, and
when the switch is turned OFF, a negative feedback active low-pass filter having a second parameter is formed by the operational amplifier, the resistor and the capacitor, and the amplifier operates in the narrow bandwidth.

* * * * *